(12) United States Patent
Laporte et al.

(10) Patent No.: US 8,299,869 B2
(45) Date of Patent: Oct. 30, 2012

(54) SETTING OF A BALUN

(75) Inventors: Claire Laporte, Tours (FR); Hilal Ezzeddine, Tours (FR)

(73) Assignee: STMicroelectronics (Tours) SAS, Tours (FR)

( * ) Notice: Subject to any disclaimer, the term of this patent is extended or adjusted under 35 U.S.C. 154(b) by 372 days.

(21) Appl. No.: 12/648,165

(22) Filed: Dec. 28, 2009

(65) Prior Publication Data

US 2010/0167667 A1    Jul. 1, 2010

(30) Foreign Application Priority Data

Dec. 30, 2008  (FR) ...................................... 08 59110

(51) Int. Cl.
*H03H 7/42* (2006.01)
*H01P 3/08* (2006.01)

(52) U.S. Cl. ............................................ 333/25; 333/4

(58) Field of Classification Search ................... 333/25, 333/26, 238, 4, 5

See application file for complete search history.

(56) References Cited

U.S. PATENT DOCUMENTS

| | | | |
|---|---|---|---|
| 7,072,636 B2* | 7/2006 | Dobrovolny | 455/313 |
| 7,129,803 B2* | 10/2006 | Khorram et al. | 333/25 |
| 7,269,391 B2* | 9/2007 | Chiu et al. | 455/83 |
| 7,626,472 B2* | 12/2009 | Davies-Venn et al. | 333/26 |
| 7,777,589 B2* | 8/2010 | Lee et al. | 333/25 |
| 2006/0087384 A1 | 4/2006 | Ezzendine | |
| 2008/0303606 A1 | 12/2008 | Liu et al. | |

OTHER PUBLICATIONS

French Search Report dated Sep. 22, 2009 from corresponding French Application No. 08/59110 filed on Sep. 30, 2008.

\* cited by examiner

*Primary Examiner* — Dean O Takaoka

(74) *Attorney, Agent, or Firm* — Wolf, Greenfield & Sacks, P.C.

(57) ABSTRACT

A balun including on the common-mode side, an inductive element in series with a first capacitive element between a first common-mode access terminal and the ground; and on the differential-mode side, two inductive windings in series having first respective ends defining differential access terminals and having second common ends connected to ground, second capacitive elements being respectively connected in parallel on the differential-mode windings.

14 Claims, 3 Drawing Sheets

SETTING OF A BALUN

CROSS REFERENCE TO RELATED APPLICATIONS

This application claims the priority benefit of French patent application number 08/59110, filed on Dec. 30, 2008, entitled "SETTING OF A BALUN," which is hereby incorporated by reference to the maximum extent allowable by law.

BACKGROUND OF THE INVENTION

1. Field of the Invention

The present invention relates to the field of baluns. Such transformers are intended to convert a common-mode signal into a differential-mode signal and conversely, and to avoid disturbances introduced by a ground plane of the circuit, a parasitic coupler, etc.

Baluns generally equip radio transceiver chains. They are in charge of converting common-mode signals received by an antenna into differential signals exploitable by processing circuits and, conversely, of converting differential signals to be transmitted into a common-mode signal for the antenna.

2. Discussion of the Related Art

A balun comprises a common-mode access, generally on the side of a communication antenna, and two differential-mode accesses intended to be connected to circuits for processing received signals or signals to be transmitted. Electrically, the balun is equivalent to an inductive assembly comprising coupled inductances. Typically, an inductance (or two inductances in series) connect the common-mode access to a terminal which may be floating or grounded by a capacitive element. An inductance with a midpoint or two inductances in series connect the differential-mode accesses, the midpoint of this series association being generally grounded.

Baluns are divided in three categories. A first category relates to so-called distributed baluns, formed of transmission lines coupled to one another. A second category relates to so-called active baluns, formed of transistors. A third category relates to so-called lumped baluns, formed of inductive and possibly discrete capacitive components. The present invention relates to distributed baluns of the first category.

The features which are desired to be respected are low insertion losses, a good impedance matching, and minimum phase and amplitude imbalances between the differential paths.

When the balun is associated with a transmit chain, an oscillator providing a frequency to a modulator of the data to be transmitted is generally placed upstream. The oscillator (typically, a voltage-controlled oscillator—VCO) generally delivers a signal at a frequency which is a multiple (generally, double or half) of the carrier frequency (of the useful signal).

The circuits connected downstream of the modulator are generally sized according to the central frequency of the useful band. Accordingly, their impedance at another frequency is generally not optimized.

In case of a variation of the impedance seen by the oscillator, the oscillator is likely to undergo a frequency drift. This phenomenon is generally called "pulling". Now, in a transmit chain, a variation of the oscillator frequency generates a variation of the carrier frequency.

Theoretically, the balun should exhibit a given impedance at the frequency of the useful signal and another given impedance at the oscillator frequency. The two criteria are often incompatible with usual balun structures.

US-A-2008/303606 discloses a wide-band balun in which the common mode winding is in series with a capacitor connected between said winding and the terminal on which the signal is applied, the other terminal of the common mode winding being directly grounded.

SUMMARY OF THE INVENTION

At least one embodiment of the present invention aims at providing a balun of distributed-line type which overcomes all or part of the disadvantages of usual baluns.

At least one embodiment of the present invention more specifically aims at providing a balun structure which enables to obtain two different impedances for two different frequencies.

At least one embodiment of the present invention further aims at a solution requiring no modification of the circuits connected upstream and downstream of the balun.

Thus, an embodiment of the present invention provides a balun comprising:

on the common mode side, an inductive element in series with a first capacitive element between a first common-mode access terminal and the ground said capacitive element being connected between said inductive element and ground; and on the differential mode side, two inductive windings in series having first respective ends defining differential access terminals and having second common ends connected to ground, and second capacitive elements respectively connected in parallel on the differential-mode windings.

According to an embodiment of the present invention, the value of the second capacitive elements is selected to define an impedance on the differential mode side at a second frequency different from a first frequency approximately centered on the bandwidth.

According to an embodiment of the present invention, the second frequency corresponds to the frequency of an oscillator connected on the differential mode side.

According to an embodiment of the present invention, the inductive elements are made in the form of planar conductive windings.

According to an embodiment of the present invention, the value of the first capacitive element is selected to define the impedance ratio between common mode access and differential mode accesses at a first frequency corresponding to the central frequency of the bandwidth.

According to an embodiment of the present invention, the inductive windings are made in the form of several interdigited windings superposed in two conductive levels.

At least one embodiment of the present invention also provides a radio transmit circuit comprising:

at least one transmit or receive path comprising at least one balun;

at least one oscillator.

At least one embodiment of the present invention also provides a transceiver device comprising at least such a circuit.

The foregoing objects, features, and advantages of the present invention will be discussed in detail in the following non-limiting description of specific embodiments in connection with the accompanying drawings.

DETAILED DESCRIPTION

Figure 1:
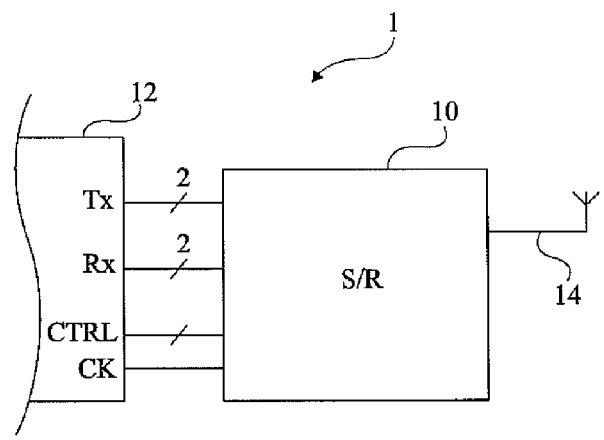
FIG. 1 is a simplified representation of a radio transceiver device of the type to which the present invention applies as an example.

The same elements have been designated with the same reference numerals in the different drawings.

For clarity, only those elements which are useful to the understanding of the present invention have been shown and will be described. In particular, the circuits for generating the data to be transmitted and for exploiting the data received by the described transceiver device have not been detailed, the present invention being compatible with usual processings of generation and exploitation of these data.

FIG. 1 is a simplified representation of a communication device 1 using a radio-frequency transceiver circuit (S/R) 10. Device 1 comprises one or several circuits 12 for generating signals to be transmitted Tx and for exploiting received signals Rx. Circuit 10 receives, from circuit 12, differential signals Tx to be transmitted, one or several control signals CTRL as well as a clock or synchronization signal CK, and transmits to circuit 12 differential reception signals Rx. Circuit 10 is connected to one or several antennas 14.

A device such as illustrated in FIG. 1 may be found, for example, for example, in communication devices such as cell phones, PDAs, micro-computers, etc.

Figure 2:
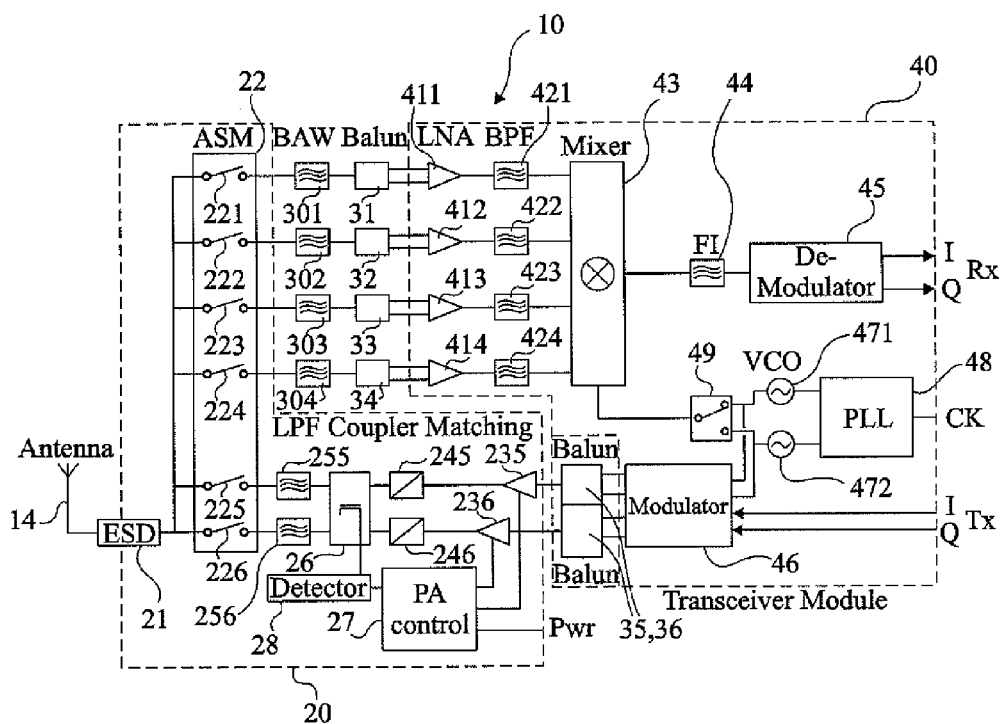
FIG. 2 is a detailed block diagram of the elements of an example of a multiband radio transceiver device.

FIG. 2 is a more detailed block diagram of a transceiver device 10. Especially for a cell phone, a same device is likely to operate on several frequency bands in transmit and receive mode. However, the present invention also applies to a single-band transmit device.

In the illustrated example, the device has two transmit paths and four reception paths sharing a same antenna 14. Antenna 14 is connected to a circuit 20 performing path switching and impedance matching functions in transmit mode. The end of antenna 14 is connected to a terminal, preferably equipped with means of protection against electrostatic discharges (block 21, ESD). Block 21 is connected to first terminals of an analog multipath switch 22 (ASM) in charge of selecting a transmit path and a receive path by a switch network 221 to 226. Second terminals of the four switches 221 to 224 define the receive paths. Each receive path comprises a filter 301 to 304, for example, a bulk-acoustic wave filter (BAW), followed by a balun 31 to 34 converting the received signal into a differential signal. The differential signals are then amplified by low-noise amplifiers 411 to 414 (LNA) having their respective outputs processed by filters 421 to 424 of band-pass type (BPF) having a bandwidth which depends on the frequency of the considered path. The outputs of filters 421 to 424 are sent to a mixer 43. The function of the mixer is to convert to baseband (intermediary frequency) the received signals. It delivers a signal at the intermediary frequency whatever the path. This signal is filtered by a band-pass filter 44 at intermediary frequency FI. The output of filter 44 is exploited by a demodulator 45 delivering, in phase quadrature (output terminals I and Q), received signal Rx. Low-noise amplifiers 41, band-pass filters 42, mixer 43, filter 44, and demodulator 45 are most often integrated in a circuit 40 forming a transceiver module.

On the transmit side, module 40 comprises a modulator 46 receiving, in phase quadrature (input terminals I and Q), signal Tx to be transmitted. Modulator 46 receives as many carriers as there are transmit paths at different frequencies. In the shown example, two voltage-controlled oscillators (VCO) 471 and 472 are controlled by a phase-locked loop (PLL) 48 receiving clock signal CK. The respective outputs of oscillators 471 and 472 are sent, on the one hand, to modulator 46 and, on the other hand, via selector 49, to mixer 43 of the receive portion to enable its baseband conversion. As a variation, a selector, not shown, is interposed between the oscillators and modulator 46.

Modulator 46 comprises as many differential output pairs as there are transmit paths. Each transmit path comprises a balun 35, 36 having its common-mode output amplified by an amplifier 235, 236. The outputs of amplifiers 235 and 236 are processed by impedance matching circuits 245 and 246 having their respective outputs sent onto low-pass filters 255 and 256 (LPF) after having crossed a coupler 26. The function of coupler 26 is to control the power of amplifiers 235 and 236 by means of a control circuit 27 (PA control) receiving a signal Pwr for controlling circuit 12 and a signal representative of the transmitted power of a detector 28 sampling data relative to the power on the secondary line of coupler 26. The respective outputs of filters 255 and 256 are sent onto second terminals of switches 225 and 226.

The operation of the transceiver module of FIG. 2 is usual.

Figure 3:
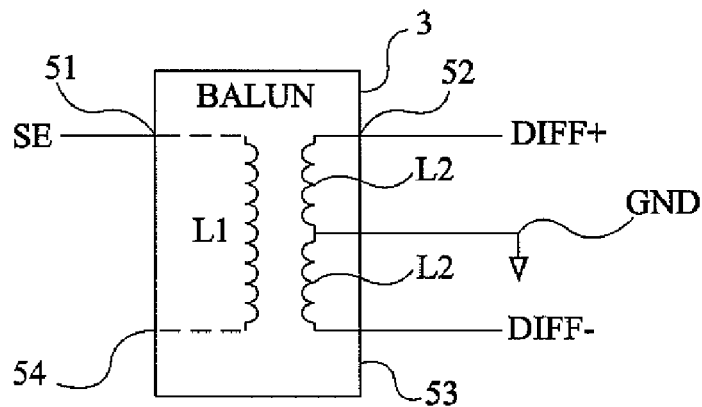
FIG. 3 schematically shows a usual example of a balun.

FIG. 3 is a diagram of a balun 3 illustrating its equivalent electric diagram. A first common-mode terminal (port 51) SE (single-end) is connected by a first inductive element L1 to a terminal 54 of the coupler, which has been for example left floating, while the two differential access terminals (ports 52 and 53) DIFF+ and DIFF− are connected to each other by two inductive elements L2 of same values in series. The junction point of these two inductive elements is connected to ground GND.

In a transmit or receive path, such a balun should be associated with a circuit of impedance matching to the load formed by the downstream circuits.

To avoid an impedance-matching circuit, it has already been provided to ground second terminal 54 through a capacitor (not shown in FIG. 3). The value of the capacitance is selected according to the impedance ratio desired for the balun at the useful frequency, to reduce insertion and return losses. An example of such a balun where the impedance ratio is set on the common-mode side is described in US patent application US-A-2006/087384 (04/TO/229-B6653). The function of the capacitor is to change the impedance ratio between the common-mode and differential-mode accesses, and to adjust the operating frequency of the balun.

However, this matching has no effect upon a frequency remote from the useful frequency, such as twice or half this frequency.

Thus, a variation of the balun load on the common-mode side is likely to cause a drift of the voltage-controlled oscillator 471 or 472, and thus of the frequency of the carrier used by modulator 46.

Figure 4:
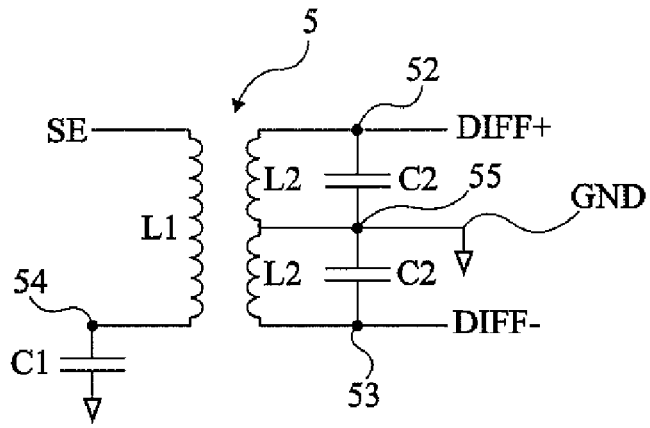
FIG. 4 shows the equivalent electric diagram of an embodiment of a balun.

FIG. 4 is an equivalent electric diagram of an embodiment of a balun 5 according to the present invention.

A first difference with respect to the balun shown in FIG. 3 is the presence of a capacitive element C1 in series with common-mode winding L1 (between port 54 and the ground). The function of this capacitor is, as indicated hereabove, to set the impedance ratio of the balun at frequency f0 of the useful signal and to adjust the operating frequency band.

Another difference is the presence, on the differential-mode side, of two capacitive elements C2 of same value, respectively in parallel on the two inductive elements L2. Accordingly, each port 52, 53 is connected to ground GND by a capacitive element C2 (in parallel on its inductive element L2).

The inventors have discovered that the presence of a capacitor in parallel with each differential-mode winding provides a possibility of setting the balun impedance at a frequency different from that of the useful signal, without upsetting the matching of the balun at the useful frequency on the common-mode side.

Figure 5:
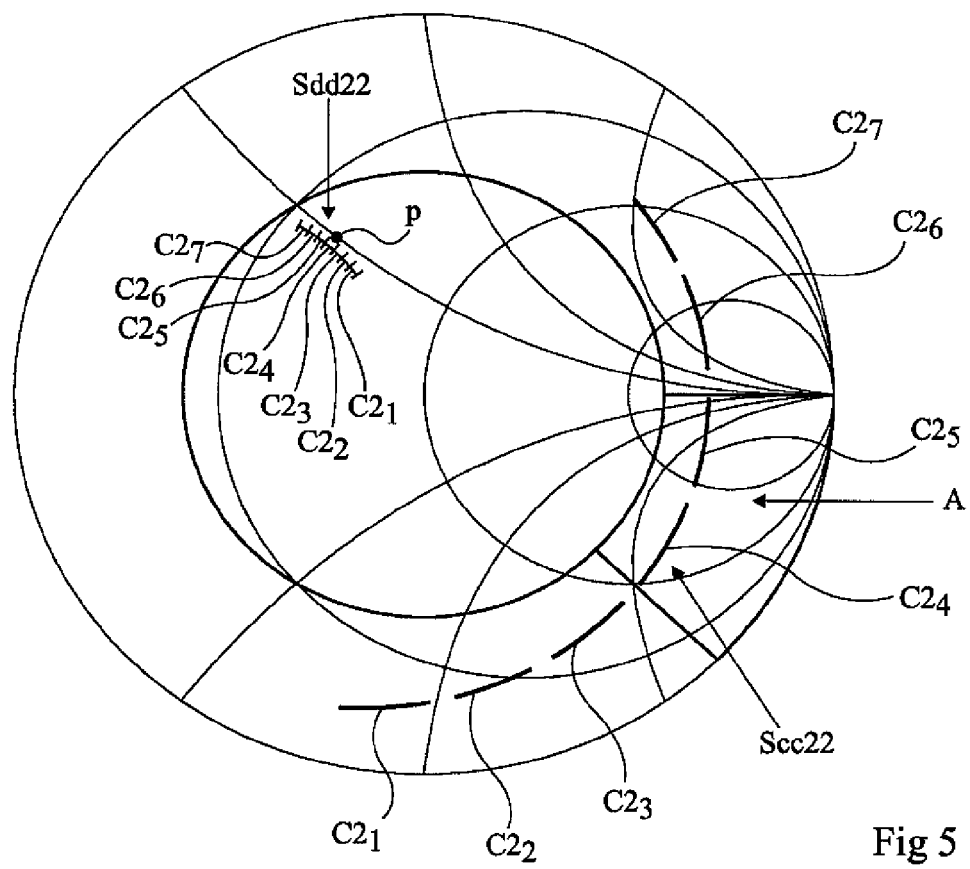
FIG. 5 is a Smith chart illustrating the operation of the balun of FIG. 4.

FIG. 5 is a Smith chart illustrating the operation of the balun of FIG. 4 for different values of capacitances C2.

The dimensions given to the windings of the inductive elements depend on central frequency f0 of the bandwidth desired for the balun.

Capacitor C1 is selected according to the impedance ratio desired for the balun at this frequency f0 (for example, as described in above-mentioned document USA-2006/087384). This selection leads to an operating point p.

According to values $C2_1$, $C2_2$, $C2_3$, $C2_4$, $C2_5$, $C2_6$, and $C2_7$ given to capacitances C2, a parameter Scc22, which represents the reflection coefficient at the common-mode output when the differential-mode input is matched, varies. However, parameter Sdd22, representing the reflection coefficient at the differential output when the common-mode input is matched, only very slightly varies for the different values of capacitance C2.

The selection of the value of capacitances C2 depends on the matching desired for the oscillator.

For example, this value determination is performed as follows.

Usually, an area A of desired impedance for which the oscillator has the best operation is empirically determined. The values to be given to capacitors C2 (for example, either value $C2_4$, or value $C2_5$) are then selected by simulation. For example, a zero value is first assigned and coefficient Scc22 is placed on the Smith chart. Then, the value is progressively increased until it enters area A. The more the value of capacitances C2 increases, the further clockwise the value of coefficient Scc22 moves.

Figure 6:
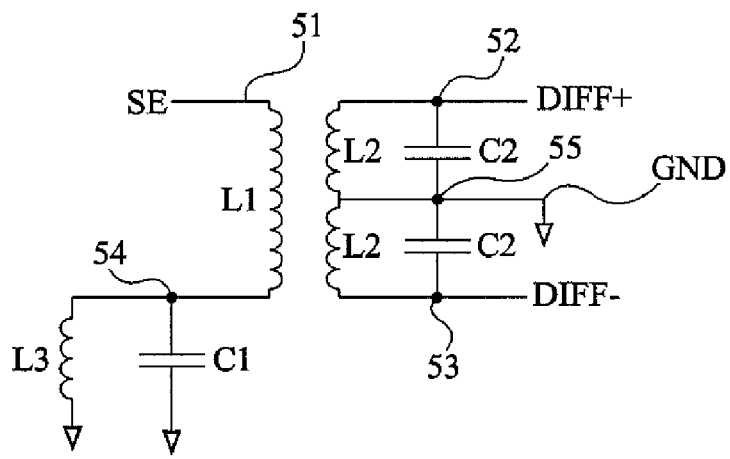
FIG. 6 shows another embodiment of a balun.

FIG. 6 shows the electric diagram of another embodiment of a balun. As compared with the embodiment of FIG. 4, an inductive element L3 is assembled in parallel on capacitive element C1. The function of this inductive element is to provide a protection against electrostatic discharges on the common-mode side. It should be noted that, on the differential mode side, inductive elements L2 provide this protection against electrostatic discharges for elements C2. Traditionally, on the common-mode side, an inductive element is placed on port 51 (input SE). An advantage of transferring the electrostatic protection inductance onto port 54 is to decrease its value by taking advantage of capacitor C1 to form an LC cell.

Figure 7:
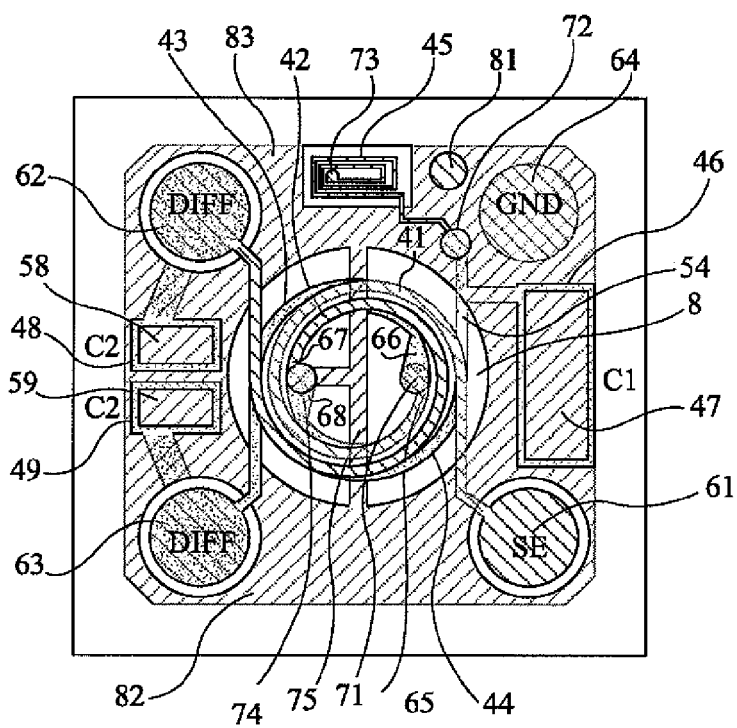
FIG. 7 is a top view of an embodiment of the balun of FIG. 6 in distributed lines.

FIG. 7 is a top view of an embodiment of a balun of FIG. 6 made in the form of stacked conductive windings, interdigited two by two, preferably all of same length, selected according to the bandwidth desired for the balun.

The balun of FIG. 7 is formed in a stacking of three conductive levels 81, 82, and 83 separated by insulating levels (not shown in the drawing). Intermediary level 82 comprises the ground connection (it defines a ground plane, except above the different windings). A grounding terminal 64 is, for example, taken back to upper level 81 by a via.

Inductance L1 of the common-mode branch (also designated as the transformer primary) is formed by a planar winding 41 in first level 81 (arbitrarily on top) between an external pad 61 forming the common-mode access 51 of the balun and an internal end 65. For example, winding 41 winds counterclockwise from the outside to the inside. Internal end 65 of winding 41 is connected by a via 71 to an internal end 66 of a planar winding 44 formed in level 83. Winding defines the second portion of inductive element L1 and winds counterclockwise from its internal end 66 to an external end 54. End 54 defines the fourth port, connected to first electrode 46 of capacitor C1 formed in level 83. Second electrode 47 of capacitor C1 is the ground plane in level 82. End 54 is also connected, by a via 72, to a winding 45 (for example, rectangular) formed in level 81 outside of the transformer to define inductance L3. Winding 45 winds clockwise from the outside to the inside and its internal end is connected, by a via 73, to the ground plane.

On the differential mode side, a first one of inductances L2, by being made in the form of a planar conductive winding 42 in first level 81, interdigited with winding 41 is coupled to winding 41. Thus, winding 42 also winds counterclockwise between an external pad 62 defining differential-mode access 52 and a central end 67. End 67 is connected, by a via 74, to an internal end 68 of a winding 43 made in level 83 and interdigited with winding 44. The external end of winding 43 is connected by a via to a pad 63 in level 81 defining access 53. Further, the respective internal ends 67 and 68 of windings 42 and 43 are connected by a conductive bridge 74 to the ground plane of level 82. Finally, the respective external ends of windings 42 and 43 are connected to first respective electrodes 48 and 49 of capacitors C2 in level 83. Second electrodes 58 and 59 of capacitors C2 are in the ground plane.

The above-described balun is intended to form at least each of baluns 35 and 36 of FIG. 2.

As a specific embodiment, a balun intended for a 2.45-Gigahertz frequency has been formed with planar windings of 1 turn and a half. The impedance ratio of this balun is 50 to 50+j50 (complex impedance) with a 3.1-picofarad capacitance C1. For a voltage-controlled oscillator frequency of 4.9 gigahertz, the selected capacitive elements C2 were of 1.3 picofarad. Such a balun formed according to FIG. 7 takes up a surface area of 1.3 by 1.2 mm$^2$.

Compared to a wide range balun having a capacitor connected on the common mode terminal side (US-A-2008/303606 already cited), the disclosed combination provides a higher resonance frequency. Further, the connection of the capacitor between the common mode winding and ground saves a via in an integrated embodiment.

An advantage of the described embodiments is to limit drifts of the voltage-controlled oscillator of the transmitter, by providing an optimal impedance for the oscillator operation.

Another advantage is that the presence of capacitive elements does not adversely affect the balun performances in the desired operating frequency band, defined by the lengths of the inductive windings, which are a function of one quarter of the wavelength.

Another advantage is that the described embodiments decrease the general surface area with respect to the surface area taken up by a balun and an impedance-matching element.

Specific embodiments of the present invention have been described and various alterations and modifications will occur to those skilled in the art. In particular, the dimensions to be given to the inductive and capacitive elements and to their respective definition surface area are within the abilities of those skilled in the art based on the functional indications given hereabove and on the definition and simulation tools currently used to size baluns. Further, if the forming of circular windings and of a capacitor of square surface is a preferred embodiment, other shapes are possible, provided to respect the nature of the balun. Moreover, the manufacturing of a balun by using conductive deposition and multiple-layer circuit processes conventional in electronics is within the abilities of those skilled in the art. It should finally be noted that it will be within the abilities of those skilled in the art to combine various elements of these various embodiments and variations without involving any inventive step.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A balun comprising:
   on a common-mode side, an inductive element in series with a first capacitive element between a first common-mode access terminal and ground; and
   on a differential-mode side, two inductive windings in series having first respective ends defining differential access terminals and having second common ends connected to ground,
   wherein second capacitive elements are respectively connected in parallel on the differential-mode windings, wherein the value of the second capacitive elements is selected to define an impedance on the differential-mode side at a second frequency different from a first frequency approximately centered on a bandwidth of the balun.

2. The balun of claim 1, wherein the second frequency corresponds to the frequency of an oscillator connected on the differential mode side.

3. The balun of claim 1, wherein the inductive elements are made in the form of planar conductive windings.

4. The balun of claim 1, wherein the value of the first capacitive element is selected to define the impedance ratio at the bandwidth frequency.

5. The balun of claim 1, wherein the inductive windings are made in the form of several interdigitated windings superposed in two conductive levels.

6. A radio transmit circuit comprising:
   at least one transmit or receive path comprising at least one balun;
   at least one oscillator, wherein the balun is the balun of claim 1.

7. A transceiver device comprising at least one circuit of claim 6.

8. A balun comprising:
   a common-mode side including a first inductive element in series with a first capacitive element between a common mode terminal and a reference voltage; and
   a differential-mode side including second and third inductive elements having first ends defining respective differential-mode terminals and having second ends connected to the reference voltage; and second and third capacitive elements respectively coupled in parallel with the second and third inductive elements, wherein the first capacitive element has a value that defines an impedance of the balun at a first frequency and wherein the second and third capacitive elements have values that define an impedance of the balun at a second frequency different from the first frequency.

9. A balun as defined in claim 8, wherein the inductive elements comprise planar conductive windings.

10. A balun as defined in claim 8, wherein the inductive elements comprise interdigitated windings in two conductive levels.

11. A balun as defined in claim 8, further comprising a fourth inductive element connected in parallel with the first capacitive element.

12. A balun as defined in claim 8, wherein the second and third capacitive elements have equal values.

13. A balun as defined in claim 8, wherein the reference voltage is ground.

14. A balun as defined in claim 8, wherein the second frequency corresponds to an oscillator frequency of an oscillator coupled to the differential-mode side.

* * * * *